(12) United States Patent
Ochs et al.

(10) Patent No.: US 8,794,074 B2
(45) Date of Patent: Aug. 5, 2014

(54) SENSOR MODULE AND METHOD FOR PRODUCING A SENSOR MODULE

(75) Inventors: Eric Ochs, Tuebingen (DE); Frieder Haag, Wannweil (DE); Eckart Schellkes, Tuebingen (DE)

(73) Assignee: Robert Bosch GmbH, Stuttgart (DE)

(*) Notice: Subject to any disclaimer, the term of this patent is extended or adjusted under 35 U.S.C. 154(b) by 748 days.

(21) Appl. No.: 12/610,667

(22) Filed: Nov. 2, 2009

(65) Prior Publication Data

US 2010/0107769 A1    May 6, 2010

(30) Foreign Application Priority Data

Nov. 6, 2008  (DE) .......................... 10 2008 043 517

(51) Int. Cl.
    *G01L 19/04*    (2006.01)
(52) U.S. Cl.
    USPC ............................................................. 73/708
(58) Field of Classification Search
    USPC ............................................................. 73/708
    See application file for complete search history.

(56) References Cited

U.S. PATENT DOCUMENTS

| | | | | |
|---|---|---|---|---|
| 5,079,953 A | * | 1/1992 | Martin et al. .................... | 73/718 |
| 5,086,777 A | * | 2/1992 | Hishii ............................ | 600/578 |
| 5,741,975 A | * | 4/1998 | Vaughn et al. .................. | 73/706 |
| 6,300,169 B1 | * | 10/2001 | Weiblen et al. ............... | 438/127 |
| 6,422,085 B1 | * | 7/2002 | Hegner et al. .................. | 73/706 |
| 7,171,857 B2 | * | 2/2007 | Barron .......................... | 73/719 |
| 7,194,375 B2 | * | 3/2007 | Yamakawa .................... | 702/138 |
| 7,343,806 B2 | * | 3/2008 | Muchow et al. ............... | 73/715 |
| 7,737,544 B2 | * | 6/2010 | Mueller et al. ................ | 257/687 |
| 7,855,426 B2 | * | 12/2010 | Haag et al. .................... | 257/434 |
| 7,878,067 B2 | * | 2/2011 | Silverbrook et al. ........... | 73/708 |
| 7,964,954 B2 | * | 6/2011 | Schmitt ......................... | 257/687 |
| 8,176,790 B2 | * | 5/2012 | Birch et al. .................... | 73/705 |
| 2005/0253240 A1 | * | 11/2005 | Nuechter et al. .............. | 257/686 |
| 2007/0040230 A1 | * | 2/2007 | Reichenbach et al. ........ | 257/414 |
| 2007/0222005 A1 | | 9/2007 | Schmitt | |

FOREIGN PATENT DOCUMENTS

| | | |
|---|---|---|
| CN | 1334919 | 2/2002 |
| CN | 101053086 | 10/2007 |
| DE | 10 2005 038 443 | 2/2007 |
| DE | 10 2008 011 943 | 9/2009 |
| EP | 0762097 | * 3/1997 |

* cited by examiner

*Primary Examiner* — Lisa Caputo
*Assistant Examiner* — Octavia D. Hollington
(74) *Attorney, Agent, or Firm* — Kenyon & Kenyon LLP

(57) ABSTRACT

A sensor module is provided having a sensor element, a housing and a substrate, the sensor element being situated on the substrate and the sensor element is provided to be at least partially embedded in the housing; and the sensor module further having a compensation element for compensating for thermal deformations of the housing; the housing being essentially situated between the substrate and the compensation element.

14 Claims, 2 Drawing Sheets

SENSOR MODULE AND METHOD FOR PRODUCING A SENSOR MODULE

RELATED APPLICATION INFORMATION

The present application claims priority to and the benefit of German patent application no. 10 2008 043 517.1, which was filed in Germany on Nov. 6, 2008, the disclosure of which is incorporated herein by reference.

FIELD OF THE INVENTION

The present invention relates to a sensor module and a method for producing a sensor module.

BACKGROUND INFORMATION

Such sensor modules are generally familiar. German patent document DE 10 2005 038 443 A1, for example, discusses a sensor system having a substrate and a housing, the housing essentially completely surrounding the substrate in a first substrate region; in a second substrate region, the housing being provided at least partially using an opening that is open; and in the region of the opening, the substrate region being provided extending from the housing. Because of the extending of the second substrate region from the housing, the influencing of the characteristics curve of a stress-sensitive sensor element is prevented, based on different thermal expansion of the housing and the substrate, since an active sensor area of the sensor element should be positioned in the second substrate area, and thus outside the housing, and to a great extent thermally decoupled from the housing.

Unpublished German patent application DE 20 2008 011 943.1 discusses a sensor system, in which a sensor element is situated on a carrier and one region of the sensor element being embedded in the molded housing; and the carrier being embedded in an edge region of a through hole of the molded housing; and, moreover, a sensitive area of a sensor system being situated in the vicinity of the through hole, and consequently also outside the molded housing. Thus, on the one hand, the sensitive region may be thermally decoupled from the molded housing and, on the other hand, the spatial separation between the upper side of the housing and the lower side of the housing may be implemented, so that the sensor system represents a barrier for a measuring medium, and consequently one is able to use it for installation in a sealed connection between spatial regions, such as in the interior space of an automobile outer housing.

A different thermal expansion between the housing and the substrate is conditioned particularly by the use of a molded housing made of plastic as the housing and of a leadframe made of metal as the substrate, whereby a comparatively cost-effective production of such sensor modules is achieved. What is disadvantageous in the thermal decoupling according to the related art is that the sensitive region of the sensor element is completely exposed, both because of the extending out of the second substrate region and because of the through hole in the molded housing respectively, and is consequently exposed in an unprotected manner to potential environmental influences, such as contamination, mechanical damage or spurious electromagnetic radiation.

SUMMARY OF THE INVENTION

The sensor module, according to the exemplary embodiments and/or exemplary methods of the present invention, and the method for producing a sensor module, according to the alternate independent claims, have the advantage over the related art that, in a manner that is comparatively simple and cost-effective to implement, thermal deformations of the sensor module using the compensation element are effectively prevented, and, at the same time, the compensation element protects the housing and/or the sensor element from undesired outer environmental influences. The sensor module according to the exemplary embodiments and/or exemplary methods of the present invention is consequently considerably more robust and less sensitive to contamination, mechanical damage and/or spurious electromagnetic radiation. This is achieved by situating the housing between the compensation element and the substrate. The housing and/or the sensor element are thus protected or at least partially covered by the compensation element on the first side facing away from the substrate. The compensation element may include a metal, so that electromagnetic screening of the sensor element on the first side is implemented by the compensation element.

In a particular manner, the compensation element is developed to be essentially flat and/or plate-shaped, and may be aligned essentially parallel to the main plane of extension of the substrate. In addition, because of the compensation element, a thermomechanical stress between the substrate and the housing is compensated for in such a way that an arching tendency of the housing out of the main plane of extension of the substrate (i.e. perpendicular to the main direction of extension) is prevented. The sensor module is made symmetrical by the compensation plate, so that the thermomechanical stress acting on the housing, for instance, during the curing of the housing material or in response to temperature fluctuations, is also made symmetrical with respect to the main plane of extension, and thus the arching tendency out of the main plane of extension is prevented. The housing may include a molded housing, the compensation element may just compensate for the thermomechanical stress between the substrate and the housing that is generated during the curing of the molding material, and preventing arching of the housing.

Advantageous refinements and further developments of the exemplary embodiments and/or exemplary methods of the present invention may be gathered from the dependent claims and the specification, with reference to the drawings.

According to one refinement, it is provided that the compensation element is provided for producing a temperature-independent compensation force developed on the housing. This may be achieved by having the thermal coefficient of expansion of the compensation element be unequal to the thermal coefficient of expansion of the housing. Thus, by contrast to the related art, in a particularly advantageous manner, an active and temperature-independent stress compensation is implemented, which makes possible a greater accuracy of micromechanical components. At the same time, processing processes, such as electrical contacting or precise sawing, of the sensor module is greatly simplified by a reduction in the arching. Furthermore, the planarity of the sensor module is thus achieved over a clearly greater temperature range, as compared to the related art.

According to an additional refinement, it is provided that the material of the compensation element be the same as the material of the substrate and/or that the thermomechanical material properties of the material of the compensation element be essentially equal to the thermomechanical material properties of the material of the substrate. Thus the thermomechanical stress between the housing and the substrate is just compensated for, in a particularly advantageous manner, by an essentially similar thermomechanical stress between the housing and the compensation element, and arching of the housing over the entire temperature range is prevented in a comparatively simple manner.

According to another refinement it is provided that the compensation element have a first thermal coefficient of expansion that is less than, equal to, or greater than a second thermal coefficient of expansion of the substrate.

Thus, in a particular manner, the force on the housing, starting from the substrate, is partially compensated for by the compensation force of the compensation element, is essentially exactly compensated for, or is overcompensated. The overcompensation is particularly of great advantage if additional thermomechanical stress forces are acting upon the housing, for instance, because of fastening elements of the sensor element, because of fastening elements of the substrate and/or because of a substrate carrier, since, in this case, the additional thermomechanical stress forces are also being compensated for by the compensation element.

According to one additional refinement it is provided that the compensation element have an anisotropic first coefficient of expansion. Thus, in a particularly advantageous manner, an anisotropic expansion of the substrate or an anisotropic thermomechanical stress is able to be compensated for.

According to still another refinement, it is provided that the first thickness of the compensation element be less than, equal to, or greater than a second thickness of the substrate, so that, in a particularly advantageous manner, a partial compensation, an essentially accurate compensation or an overcompensation of the thermomechanical stress of the substrate is able to be implemented.

According to another further development, it is provided that the ratio of the first thickness to the second thickness be provided to be essentially inversely proportional to the ratio of a first modulus of elasticity of the compensation element to a second modulus of elasticity of the substrate, so that, in a particularly advantageous manner, because of the corresponding selection of the ratio of the thicknesses of the compensation element and the substrate, a difference of the thermomechanical expansion of the substrate and the thermomechanical expansion of the compensation element is compensated for, based on different moduli of elasticity.

According to yet another refinement, it is provided that the compensation element has a first patterning which, essentially, is identical to a second patterning of the substrate. The thermomechanical expansion behavior of the substrate is influenced by a patterning on, or rather in the substrate, by comparison, costly patternings causing comparatively complex expansion characteristics. In an advantageous manner, an exact stress compensation of the thermomechanical expansion, caused by the patterned substrate, is nevertheless possible in a simple manner in that on, or rather in the compensation element, a patterning that is essentially identical to a patterning of the substrate is copied.

According to a further refinement, it is provided that the housing have an opening, a pressure-sensitive region of the sensor element being situated in the vicinity of the opening, and the compensation element covering the opening at least partially. Consequently, the pressure-sensitive region, which is not protected by the housing, is protected particularly advantageously by the compensation element from undesired exterior environmental influences, such as contamination, mechanical damage and/or spurious electromagnetic radiation. This is advantageous particularly because the pressure-sensitive region, in particular, has exposed, movable patternings and/or electrodes, which are comparatively sensitive to contamination (danger of short circuit and/or danger of clamping-in the movable patternings by particles), mechanical damage (danger of breakdown of movable patternings) and/or spurious electromagnetic radiation (charge induction).

According to one additional refinement it is provided that the compensation element have a through hole in the vicinity of the opening. Thus, in a particularly advantageous manner, a contact of the pressure-sensitive region to a measuring medium (for instance, a fluid or a measuring gas) is produced through the through hole, with which, for instance, a pressure of the measuring medium is made possible, using the sensor element. The sensor module is constructed in such a way, in this context, that the sensor element, for instance, represents a barrier for a measuring medium, and thus is able to be installed in a sealed connection between space regions such as the interior of an automobile outer housing.

In a particular manner, the cross section of the through hole parallel to the main plane of extension is smaller, and particularly smaller by a multiple, than the average cross section of the opening parallel to the main plane of extension, so that the compensation element gives protection to the pressure-sensitive region from the undesired outer environmental influences, such as contamination, mechanical damage and/or spurious electromagnetic radiation, in spite of the through hole.

According to still another refinement, it is provided that the substrate include a leadframe and/or that the substrate be situated on a printed-circuit board. In a particularly advantageous manner, the production costs of the sensor module are considerably reduced by the use of a leadframe as substrate. The substrate may be situated on a printed-circuit board, the printed-circuit board being advantageously used for the mechanical fixing and the electrical contacting of the substrate or of the sensor element. Within the meaning of the exemplary embodiments and/or exemplary methods of the present invention, the substrate optionally includes the printed-circuit board, so that, on account of the compensation element, the thermomechanical stress of the printed-circuit board on the housing is also compensated for. Furthermore, the substrate alternatively includes, at the same time, both the leadframe and the printed-circuit board, so that the compensation element, at the same time, partially compensates for, exactly compensates for and/or overcompensates for both the thermomechanical stress of the leadframe on the housing and the thermomechanical stress of the printed-circuit board on the housing or the substrate.

An additional subject matter, of the exemplary embodiments and/or exemplary methods of the present invention, is a method for producing a sensor module, in a first production step, the sensor element being situated on a substrate; in a second production step, the sensor element being molded to form a housing, using a molding material; and in a subsequent third production step, the compensation element being fastened onto the housing. Thus, in an advantageous manner, a sensor module is produced in a comparatively cost-effective manner, which offers a thermomechanical stress compensation against arching tendencies of the housing and protection of the housing and/or the sensor element from undesired outside environmental influences such as contamination, mechanical damage and/or spurious electromagnetic radiation. The compensation element may be connected to the housing in a continuous material fashion, and is adhered and/or laminated to the housing, in particular manner.

Exemplary embodiments of the present invention are depicted in the drawings and described in greater detail in the subsequent description.

DETAILED DESCRIPTION

Figure 1:
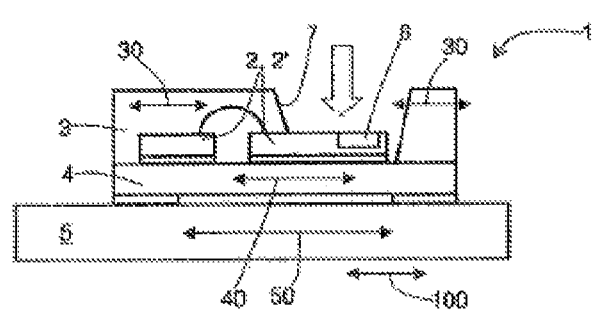
FIG. 1 shows a schematic lateral view of a sensor module according to the related art.

In the figures, identical elements are provided with the same reference numerals and thus are usually also named or mentioned only once.

FIG. 1 shows a schematic lateral view of a sensor module 1 according to the related art, sensor module 1 including a sensor element 2, 2', a housing 3 and a substrate 4. Sensor element 2, 2' is situated on substrate 4 and includes a pressure sensor having a pressure-sensitive region 6. Housing 3 has an opening 7 in the area of pressure-sensitive region 6, so that a measuring medium 8 is able to reach pressure-sensitive region 6 through opening 7. Sensor module 2, 2', inside housing 3, for example, has an electric contact in the form of a bonding wire 2". Substrate 4 in particular includes a leadframe, which is produced, for example, by stamping from sheet metal. Sensor element 2, 2' may be fastened mechanically to substrate 4, and is electrically contacted via patternings of substrate 4. Substrate 4 is situated on a printed-circuit board 5. Housing 3 includes a plastic housing that is produced in a molding process, in a first method step sensor element 2, 2' being fastened to substrate 4, and subsequently, in a second method step sensor element 2, 2' and/or substrate 4 being molded to form housing 3, using a molding material.

Because of the chemical shrinkage during curing of the molding material, and because of different thermal coefficients of expansion between the molding material and substrate 4, in response to cooling, a force is created which leads to an arching, or tendency to arch, of housing 3 out of a main plane of extension 100 of substrate 4 (i.e. perpendicular to main plane of extension 100). Especially in such "leadless" housings, the arching is comparatively pronounced, based on the asymmetrical construction. Because of the adhering or soldering of substrate 4 onto printed-circuit board 5, the danger increases that the arching becomes even greater, since printed-circuit board 5 also has a thermal coefficient of expansion that differs from the thermal coefficient of expansion of housing 3. The combination of materials of different coefficients of expansion induces stress in the sensor element, so that the characteristics curve of the sensor changes. The different thermomechanical stress in housing 3, in substrate 4 and in printed-circuit board 5 is shown schematically in FIG. 1 by the arrows 30, 40, 40' and 50.

Figure 2:
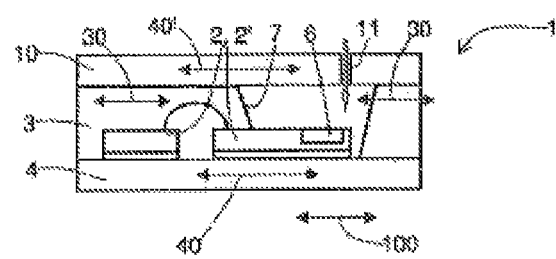
FIG. 2 shows a schematic lateral view of a sensor module according to a first specific embodiment of the present invention.

FIG. 2 shows a schematic lateral view of a position sensor module 1 according to a first specific embodiment of the present invention, the first specific embodiment being essentially similar to the sensor module illustrated in FIG. 1; sensor module 1 having a planar compensation element 10, which is situated on a side of housing 3 facing away from substrate 4, essentially parallel to the main plane of extension 100, so that housing 3 is situated between compensation element 10 and substrate 4. The first specific embodiment does not have a printed-circuit board 5. In the vicinity of opening 7, compensation element 10 has a through hole 11, through hole 11 functioning as a gas inlet/outlet for measuring medium 8. The cross section of through hole 11 parallel to main plane of extension 100, in this context, is smaller by a multiple than the average cross section of opening 7 parallel to main plane of extension 100. After the first and second method steps, in a third method step compensation element 10 is, for example, adhered and/or laminated onto the housing.

By applying compensation element 10 onto housing 3, for one thing, opening 7 is partially closed over pressure-sensitive region 6, and at the same time a compensation is created for the arching force. In this context, compensation element 10 may have a first thermal coefficient of expansion that is essentially the same or similar to a second coefficient of expansion of substrate 4 or of the leadframe. In this way, when there is a temperature change, a counteracting force is created to the arching force of substrate 4. That is, compensation element 10 is used simultaneously as protection for the housing and pressure-sensitive region 6 from undesired outer environmental influences, such as contamination, mechanical damage and/or spurious electromagnetic radiation and also for stress compensation.

Compensation element 10 may be formed from the same material or from a material having similar thermomechanical material properties as the material of substrate 4. Consequently, the counteracting force will be varied, for example, via the selection of the material thickness of compensation element 10, perpendicular to main plane of extension 100, in a quite especially particular manner, compensation element 10 having a first thickness 12 perpendicular to main plane of extension 100, which is essentially equal to a second thickness 13 of substrate 4 perpendicular to main plane of extension 100, and consequently, the force coming from substrate 4 being compensated for by an essentially equal force of compensation element 10.

Figure 3:
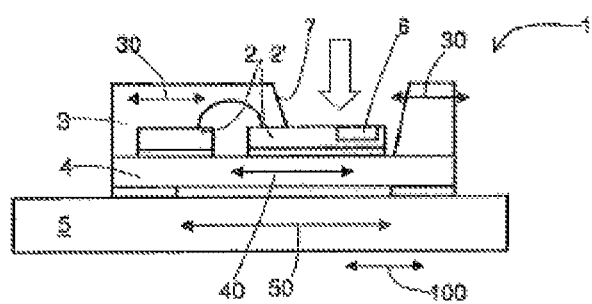
FIG. 3 shows a schematic lateral view of a sensor module according to a second specific embodiment of the present invention.

FIG. 3 shows a schematic lateral view of a position sensor module 1 according to a second specific embodiment of the present invention, the second specific embodiment being identical to the first specific embodiment illustrated in FIG. 2; substrate 4 being soldered and/or adhered onto a printed-circuit board 5 in a similar manner to that in FIG. 1; and moreover, first thickness 12 being greater than second thickness 13, so that the force of compensation element 10 overcompensates for the force of substrate 4, and consequently also compensates for the force of printed-circuit board 5.

Figure 4:
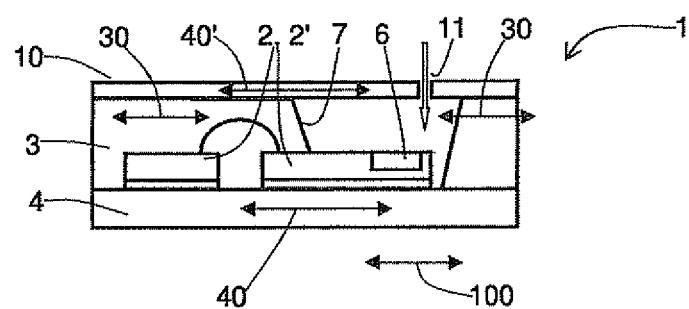
FIG. 4 shows a schematic lateral view of a sensor module according to a third specific embodiment of the present invention.

FIG. 4 shows a schematic lateral view of a sensor module 1 according to a third specific embodiment of the present invention, the third specific embodiment being essentially the same as the first specific embodiment illustrated in FIG. 2; the compensation element 10 including a plastic plate; the first thickness 12 being less than the second thickness 13. In one optional specific embodiment, first thickness 12 is related to second thickness 13 in a manner inversely proportional to the associated modulus of elasticity of substrate 4 and compensation element 10.

Figure 5:
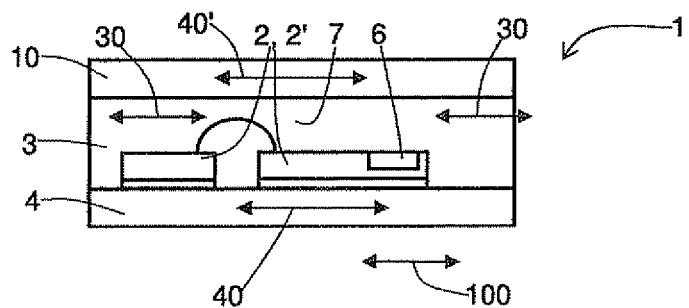
FIG. 5 shows a schematic lateral view of a sensor module according to a fourth specific embodiment of the present invention.

FIG. 5 shows a schematic lateral view of a sensor module 1 according to a fourth specific embodiment of the present invention, the fourth specific embodiment being essentially identical to the first specific embodiment illustrated in FIG. 2; sensor element 2, 2' having no pressure-sensitive region 6, housing 3 having no opening 7 and compensation element 10 having no through hole 11. Thus, compensation element 10 is used for stress compensation and for protecting housing 3 from contamination and mechanical damage. Alternatively, compensation element 10 includes a metallic material and is used at the same time for screening sensor element 2, 2' from spurious electromagnetic radiation.

What is claimed is:

1. A sensor module, comprising:
a sensor element;
a housing;
a substrate; and
a compensation element to compensate for thermal deformations of the housing;
wherein the sensor element is situated on the substrate, and the housing at least partially surrounds the sensor element,
wherein the housing is essentially situated between the substrate and the compensation element,
wherein the compensation element has a through hole in a region of an opening of the housing.

2. The sensor module of claim 1, wherein the compensation element is for producing a temperature-dependent compensation force onto the housing.

3. The sensor module of claim 1, wherein at least one of the following is satisfied: (i) a material of the compensation element is the same as a material of the substrate; and (ii) thermomechanical material properties of the material of the compensation element are essentially the same as thermomechanical material properties of the material of the substrate.

4. The sensor module of claim 1, wherein the compensation element has a first thermal coefficient of expansion which is smaller, equal to or greater than a second thermal coefficient of expansion of the substrate.

5. The sensor module of claim 1, wherein the compensation element has an anisotropic first coefficient of expansion.

6. The sensor module of claim 1, wherein a first thickness of the compensation element is less than, equal to or greater than a second thickness of the substrate.

7. The sensor module of claim 1, wherein a ratio of a first thickness to a second thickness is essentially provided to be inversely proportional to a ratio of a first modulus of elasticity of the compensation element to a second modulus of elasticity of the substrate.

8. The sensor module of claim 1, wherein the compensation element has a first patterning which is essentially identical to a second patterning of the substrate.

9. The sensor module of claim 1, wherein the housing has an opening, a pressure-sensitive region of the sensor element being situated in a region of the opening, and wherein the compensation element at least partially covers the opening.

10. The sensor module of claim 1, wherein at least one of the following is satisfied: (i) the substrate includes a leadframe, and (ii) the substrate is situated on a printed-circuit board.

11. The sensor module of claim 1, wherein the compensation element at least one of reduces and prevents an arching tendency of the housing out of a main plane of extension of the substrate.

12. The sensor module of claim 1, wherein the compensation element includes a metallic material.

13. A method for producing a sensor module, the method comprising:
positioning a sensor element on a substrate;
molding the sensor element to form a housing a molding material; and
fastening a compensation element on the housing;
wherein the sensor module includes the sensor element, the housing, the substrate, and the compensation element to compensate for thermal deformations of the housing,
wherein the sensor element is situated on the substrate, and the housing at least partially surrounds the sensor element, and wherein the housing is essentially situated between the substrate and the compensation element,
wherein the compensation element has a through hole in a region of an opening of the housing.

14. A sensor module, comprising:
a sensor element;
a housing;
a substrate; and
a compensation element to compensate for thermal deformations of the housing;
wherein the sensor element is situated on the substrate, and the housing at least partially surrounds the sensor element,
wherein the housing is essentially situated between the substrate and the compensation element,
wherein the compensation element includes a through hole parallel to a main plane of extension, and the housing includes an opening parallel to the main plane of extension, and wherein a cross section of the through hole is smaller than the average cross section of the opening.

* * * * *